US012562683B2

(12) United States Patent
Tsai et al.

(10) Patent No.: US 12,562,683 B2
(45) Date of Patent: Feb. 24, 2026

(54) OSCILLATOR DEVICE

(71) Applicant: MEDIATEK INC., Hsinchu (TW)

(72) Inventors: Ming-Chang Tsai, Hsinchu (TW); Kuan-Lin Liu, Hsinchu (TW); Hsuan-Hung Liu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/754,783

(22) Filed: Jun. 26, 2024

(65) Prior Publication Data

US 2025/0015759 A1     Jan. 9, 2025

Related U.S. Application Data

(60) Provisional application No. 63/511,917, filed on Jul. 5, 2023.

(51) Int. Cl.
*H03B 5/04* (2006.01)
*H03B 5/24* (2006.01)

(52) U.S. Cl.
CPC ................. *H03B 5/04* (2013.01); *H03B 5/24* (2013.01); *H03B 2200/0074* (2013.01)

(58) Field of Classification Search
CPC ... H03B 5/04; H03B 5/24; H03B 5/26; H03B 2200/0074; H03K 3/0231
See application file for complete search history.

(56) References Cited

U.S. PATENT DOCUMENTS

2017/0255220 A1*   9/2017   Sivakumar ............... H03B 5/04
2022/0311424 A1*   9/2022   Lee ........................... G05F 3/30

OTHER PUBLICATIONS

An, X., et al.; "A 0.01mm2 10MHz RC Frequency Reference with a 1-Point On-Chip-Trimmed Inaccuracy of ±0.28% from −45° C to 125° C in 0.18 μm CMOS;" ISSCC 2023 / Session 3 / Amplifiers and Oscillators / 3.4; Feb. 2023.

* cited by examiner

*Primary Examiner* — Jeffrey M Shin
(74) *Attorney, Agent, or Firm* — McClure, Qualey & Rodack, LLP

(57) ABSTRACT

An oscillator device includes a current generating circuit, a current source and an oscillator circuit. The current generating circuit generates first, second, third and fourth currents. The current source generates a first reference current according to the first current and the second current and a second reference current according to the third current and the fourth current. The oscillator circuit receives the first reference current and the second reference current and generates an oscillating signal. The temperature coefficient of the oscillator circuit is compensated for by the first reference current and the second reference current. At least two of the first current, the second current, the third current and the fourth current are different. The first reference current is different from the second reference current.

19 Claims, 3 Drawing Sheets

<u>100</u>

<u>100</u>

100

OSCILLATOR DEVICE

CROSS REFERENCE TO RELATED APPLICATIONS

This application claims the benefit of U.S. Provisional Application No. 63/511,917, filed Jul. 5, 2023, the entirety of which is incorporated by reference herein.

BACKGROUND OF THE DISCLOSURE

Field of the Disclosure

The disclosure relates to an oscillator, and, in particular, to an oscillator device that compensates for the temperature coefficient.

Description of the Related Art

Generally, for lower cost, a crystal oscillator (xtal) is replaced with on-chip oscillator (OSC). In some applications, the frequency variation of the temperature needs to be as small as possible. However, most OSCs use two temperature coefficient (TC) types of resistors to compensate for the frequency variation of the temperature. Due to cost considerations, two TC types of resistors are not available for some processes. Therefore, a new design for a circuit structure is needed to solve the problem described above.

BRIEF SUMMARY OF THE DISCLOSURE

The disclosure provides an oscillator device, thereby effectively compensating for the temperature coefficient of the oscillator device without the need for two temperature coefficient types of resistors, so that the frequency of the oscillator device is stabilized and not affected by the change of temperature.

An embodiment of the disclosure provides an oscillator device, which includes a current generating circuit, a current source and an oscillator circuit. The current generating circuit is configured to generate a first current, a second current, a third current and a fourth current. The current source is coupled to the current generating circuit, and is configured to generate a first reference current according to the first current and the second current, and generate a second reference current according to the third current and the fourth current. The oscillator circuit is coupled to the current source, and is configured to receive the first reference current and the second reference current and generate an oscillating signal, wherein the temperature coefficient of the oscillator circuit is compensated for by the first reference current and the second reference current. At least two of the first current, the second current, the third current and the fourth current are different. The first reference current is different from the second reference current.

According to the oscillator device disclosed by the disclosure, the current generating circuit generates the first current, the second current, the third current and the fourth current. The current source generates the first reference current according to the first current and the second current, and generates the second reference current according to the third current and the fourth current. The oscillator circuit receives the first reference current and the second reference current and generate the oscillating signal. The temperature coefficient of the oscillator circuit is compensated for by the first reference current and the second reference current. At least two of the first current, the second current, the third current and the fourth current are different. The first reference current is different from the second reference current. Therefore, the temperature coefficient of the oscillator device may be effectively compensated for without the need for two temperature coefficient types of resistors, so that the frequency of the oscillator device is stabilized and not affected by the change of temperature.

BRIEF DESCRIPTION OF THE DRAWINGS

The disclosure can be more fully understood by reading the subsequent detailed description and examples with references made to the accompanying drawings, wherein.

DETAILED DESCRIPTION OF THE DISCLOSURE

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, a person skilled in the art would selectively implement all or some technical features of any embodiment of the disclosure or selectively combine all or some technical features of the embodiments of the disclosure.

In each of the following embodiments, the same reference number represents the same or a similar element or component.

Figure 1:
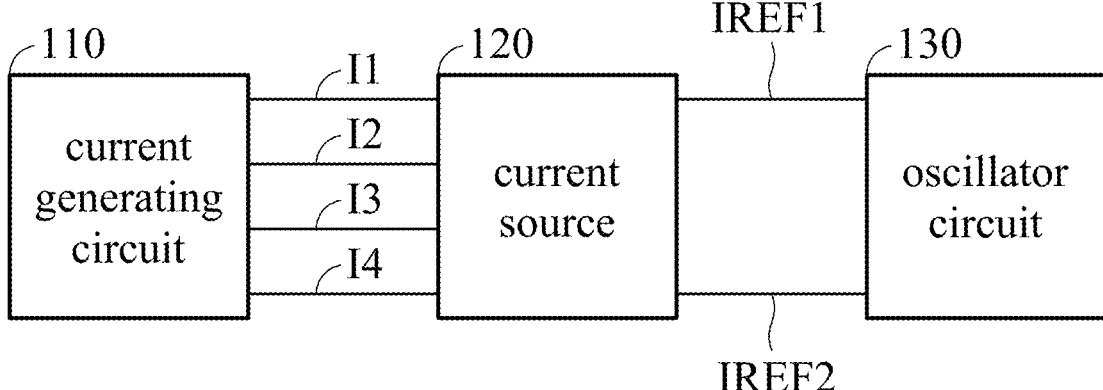
FIG. 1 is a schematic view of an oscillator device according to an embodiment of the disclosure.

FIG. 1 is a schematic view of an oscillator device according to an embodiment of the disclosure. Please refer to FIG. 1. The oscillator device 100 includes a current generating circuit 110, a current source 120 and an oscillator circuit 130.

The current generating circuit 110 may generate a first current I1, a second current I2, a third current I3 and a fourth current I4.

The current source 120 is coupled to the current generating circuit 110. The current source 120 may receive the first current I1, the second current I2, the third current I3 and the fourth current I4. The current source 120 may generate a first reference current IREF1 according to the first current I1 and the second current I2, and generate a second reference current IREF2 according to the third current I3 and the fourth current I4. For example, the current source may mix the first current I1 and the second current I2 to generate the first reference current IREF1, and mix the third current I3 and the fourth current I4 to generate a second reference current IREF2.

The oscillator circuit 130 is coupled to the current source 120. The oscillator 130 may receive the first reference current IREF1 and the second reference current IREF2 and generate an oscillating signal. In the embodiment, the temperature coefficient of the oscillator circuit 130 may be compensated for by the first reference current IREF1 and the second reference current IREF2.

In the embodiment, at least two of the first current I1, the second current I2, the third current I3 and the fourth current I4. For example, magnitudes of at least two of the first current I1, the second current I2, the third current I3 and the fourth current I4 are different, but the disclosure is not limited thereto. In some embodiments, the magnitudes of the first current I1 and the second current I2 are different, or the magnitudes of the second current I2 and the third current I3 are different, or the magnitudes of the third current I3 and the fourth current I4 are different, or the magnitudes of the fourth current I4 and the first current I1 are different. In some embodiments, the magnitudes of the first current I1, the second current I2 and the third current I3 are different, or the magnitudes the second current I2, the third current I3 and the fourth current I4 are different, or the magnitudes of the third current I3, the fourth current I4 and the first current I1 are different. In some embodiments, the magnitudes of all of the first current I1, the second current I2, the third current I3 and the fourth current I4 are different. In addition, in the embodiment, the first reference current IREF1 is different from the second reference current IREF2.

In some embodiments, the first current I1 and the third current I3 are, for example, positive temperature coefficient currents, and the second I2 and the fourth current I4 are, for example, negative temperature coefficient currents. That is, the current generating circuit 110 may generate different temperature coefficient currents. Furthermore, the positive temperature coefficient currents may be related to proportional to absolute temperature (PTAT), and the negative temperature coefficient currents may be related to complimentary to absolute temperature (CTAT).

In some embodiments, the current generating circuit 110 is, for example, a bandgap on a system on a chip (SOC), but the disclosure is not limited thereto. In other embodiments, the current generating circuit 110 may also be any suitable circuit that may generate different temperature coefficient currents. In some embodiments, the first reference current IREF1 and the second reference current IREF2 may change according to a change of temperature. Furthermore, the current source 120 may adjust the ratio of the first current I1 and the second current I2, and the current source 120 may adjust the ratio of the third current I3 and the fourth current I4 according to the change of temperature. Therefore, the temperature coefficient of the oscillator device 100 may be effectively compensated for without the need for two temperature coefficient types of resistors, so that the frequency of the oscillating signal generated by the oscillator device 100 (oscillator circuit 130) is stabilized and not affected by the change of temperature.

In some embodiments, the oscillator circuit 130 may be, for example, a frequency locked loop (FLL) oscillator, but the disclosure is not limited thereto. In some embodiments, the oscillator circuit 130 may be, for example, an RC oscillator, but the disclosure is not limited thereto.

Figure 2:
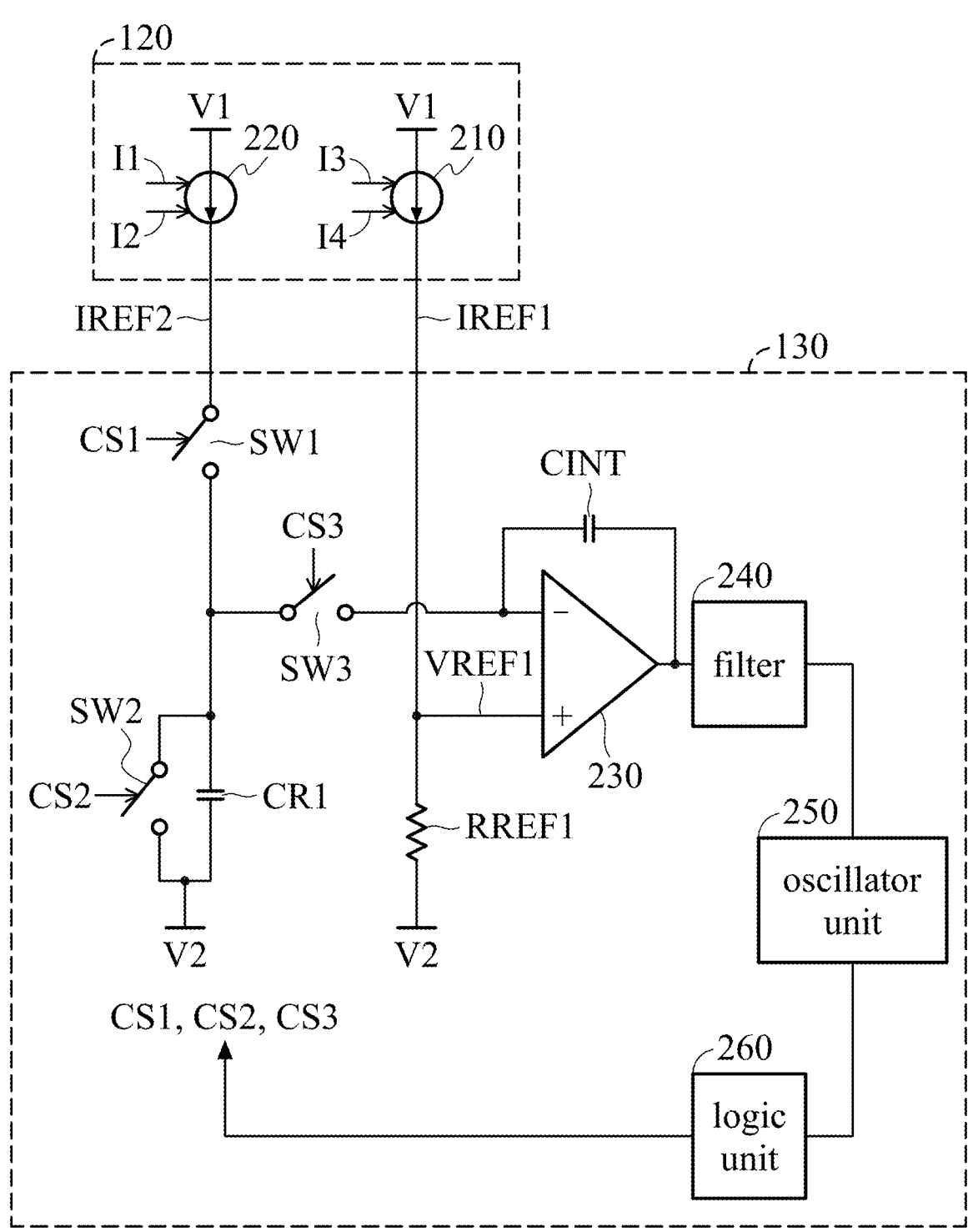
FIG. 2 is a detailed schematic view of a current source and an oscillator circuit in FIG. 1.

FIG. 2 is a detailed schematic view of a current source and an oscillator circuit in FIG. 1. Please refer to FIG. 2. The current source 120 may include a first current source unit 210 and a second current source 220. The first current source unit has a first terminal, a second terminal, a third terminal and a fourth terminal. The first terminal of the first current source unit 210 may receive a reference voltage V1. In some embodiments, the reference voltage V1 may be, for example, a system voltage, but the disclosure is not limited thereto. The second terminal of the first current source unit 210 may receive the first current I1. The third terminal of the first current source unit 210 may receive the second current I2. The fourth terminal of the first current source unit 210 may generate the first reference current IREF1.

The second current source unit 220 has a first terminal, a second terminal, a third terminal and a fourth terminal. The first terminal of the second current source unit 220 may receive the reference voltage V1. The second terminal of the second current source unit 220 may receive the third current I3. The third terminal of the second current source unit 220 may receive the fourth current I4. The fourth terminal of the second current source unit 220 may generate the second reference current IREF2.

The oscillator circuit 130 may include a resistor RREF1, an operation amplifier (OPAMP) 230, a first capacitor CINT, a filter unit 240, an oscillator unit 250, a logic unit 260, a first switch unit SW1, a second capacitor CR1, a second switch unit SW2 and a third switch unit SW3.

The resistor RREF1 has a first terminal and a second terminal. The first terminal of the resistor RREF1 may receive the first reference current IREF, and generate a voltage VREF1. The second terminal of the resistor RREF1 may receive a reference voltage V2. In some embodiments, the reference voltage V2 may be, for example, a ground voltage, but the disclosure is not limited thereto. In some embodiments, the resistor RREF1 may be any type of resistor, such as a positive temperature coefficient resistor or a negative temperature coefficient resistor, but the disclosure is not limited thereto.

The operation amplifier 230 has a first input terminal, a second input terminal and an output terminal. The first input terminal of the operation amplifier 230 is coupled to the first terminal of the resistor RREF1, and may receive the voltage VREF1. In the embodiment, the first input terminal of the operation amplifier 230 is a positive input terminal, and the second input terminal of the operation amplifier 230 is a negative input terminal, but the disclosure is not limited thereto.

The first capacitor CINT has a first terminal and a second terminal. The first terminal of the first capacitor CINT is coupled to the second input terminal of the operation amplifier 230. The second terminal of the first capacitor CINT is coupled to the output terminal of the operation amplifier 230.

The filter unit 240 has an input terminal and an output terminal. The input terminal of the filter unit 240 is coupled to the output terminal of the operation amplifier 230. The oscillator unit 250 has an input terminal and an output terminal. The input terminal of the oscillator 250 is coupled to the output terminal of the filter unit 240. The output terminal of the oscillator unit 250 may generate the oscillating signal. In some embodiments, the oscillator unit 250 may be, for example, a voltage-controlled oscillator (VCO), but the disclosure is not limited thereto.

The logic unit 260 has an input terminal and an output terminal. The input terminal of the logic unit 260 is coupled to the output terminal of the oscillator unit 250. The output terminal of the logic unit 260 may generate a first control signal CS1, a second control signal CS2 and a third control signal CS3.

The first switch unit SW1 has a first terminal, a second terminal and a control terminal. The first terminal of the first switch unit SW1 may receive the second reference current IREF2. The control terminal of the first switch unit SW1 is coupled to the output terminal of the logic unit 260 and may receive the first control signal CS1. That is, the first switch unit SW1 is turned on or turned off according to the first control signal CS1.

The second capacitor CR1 has a first terminal and a second terminal. The first terminal of the second capacitor CR1 is coupled to the second terminal of the first switch unit SW1. The second terminal of the second capacitor CR1 may receive the reference voltage V2.

The second switch unit SW2 has a first terminal, a second terminal and a control terminal. The first terminal of the second switch unit SW2 is coupled to the first terminal of the second capacitor CR1. The second terminal of the second switch unit SW2 is coupled to the second terminal of the second capacitor CR1. That is, the second switch unit SW2 is coupled to the second capacitor CR1 in parallel. The control terminal of the second switch unit SW2 is coupled to the output terminal of the logic unit 260 and may receive the second control signal CS2. That is, the second switch unit SW2 is turned on or turned off according to the second control signal CS2.

The third switch unit SW3 has a first terminal, a second terminal and a control terminal. The first terminal of the third switch unit SW3 is coupled to the second terminal of the first switch unit SW1. The second terminal of the third switch unit SW3 is coupled to the second input terminal of the operation amplifier 230. The control terminal of the third switch unit SW3 is coupled to the output terminal of the logic unit 260 and may receive the third control signal CS3. That is, the third switch unit SW3 is turned on or turned off according to the third control signal CS3.

In some embodiments, the first switch unit SW1, the second switch unit SW2 and the third switch unit SW3 are turned on in sequence. In some embodiments, the temperature coefficient of the first reference current IREF1 and the temperature coefficient of the second reference current IREF2 are related to the temperature coefficient of the resistor RREF1. That is, when the value of the resistor RREF1 changes according to a change of the temperature, the value of the first reference current IREF1 and the value of the second reference current IREF2 may also change accordingly.

For example, the frequency of the oscillating signal of the oscillating circuit 130 may be expressed by equation (1).

$$F_{OSC} = \frac{IREF2 \times N_{DIV}}{2 \times CR \times IREF1 \times RREF}, \tag{1}$$

wherein $F_{OSC}$ is the frequency of the oscillating signal, IREF2 is the second reference current, CR is the second capacitor, IREF1 is the first reference current, RREF1 is the resistor, $N_{DIV}$ is a coefficient.

According to equation (1), it can be seen that when the value of the resistor RREF1 increases according to the change of temperature, the first current source unit 210 (the current source 120) may adjust the ratio of the first current I1 and the second current I2 to adjust the first reference current IREF1 (for example, decreasing the first reference current IREF1), and the second source unit 220 (the current source 120) may the ratio of the third current I3 and the fourth current I4 to adjust the second reference current IREF2 (for example, increasing the second reference current IREF2).

In addition, when the value of the resistor RREF1 decreases according to the change of temperature, the first current source unit 210 (the current source 120) may adjust the ratio of the first current I1 and the second current I2 to adjust the first reference current IREF1 (for example, increasing the first reference current IREF1), and the second source unit 220 (the current source 120) may the ratio of the third current I3 and the fourth current I4 to adjust the second reference current IREF2 (for example, decreasing the second reference current IREF2).

That is, when the value of the resistor RREF1 changes (for example, increasing or decreasing) according to the change of temperature, the current source 120 (such as the first current source unit 210 and the second current source unit 220) may adjust the ratio of the first current I1 and the second current I2 to adjust the first reference current IREF1 and the ratio of the third current I3 and the fourth current I4 to adjust the second reference current IREF2. Therefore, the temperature coefficient the resistor RREF1 may be effectively compensated for by the first reference current IREF1 and the second reference current IREF2, so that the frequency of the oscillating signal $F_{OSC}$ of the oscillator device 100 may be stabilized and may not affected by the change of temperature.

Figure 3:
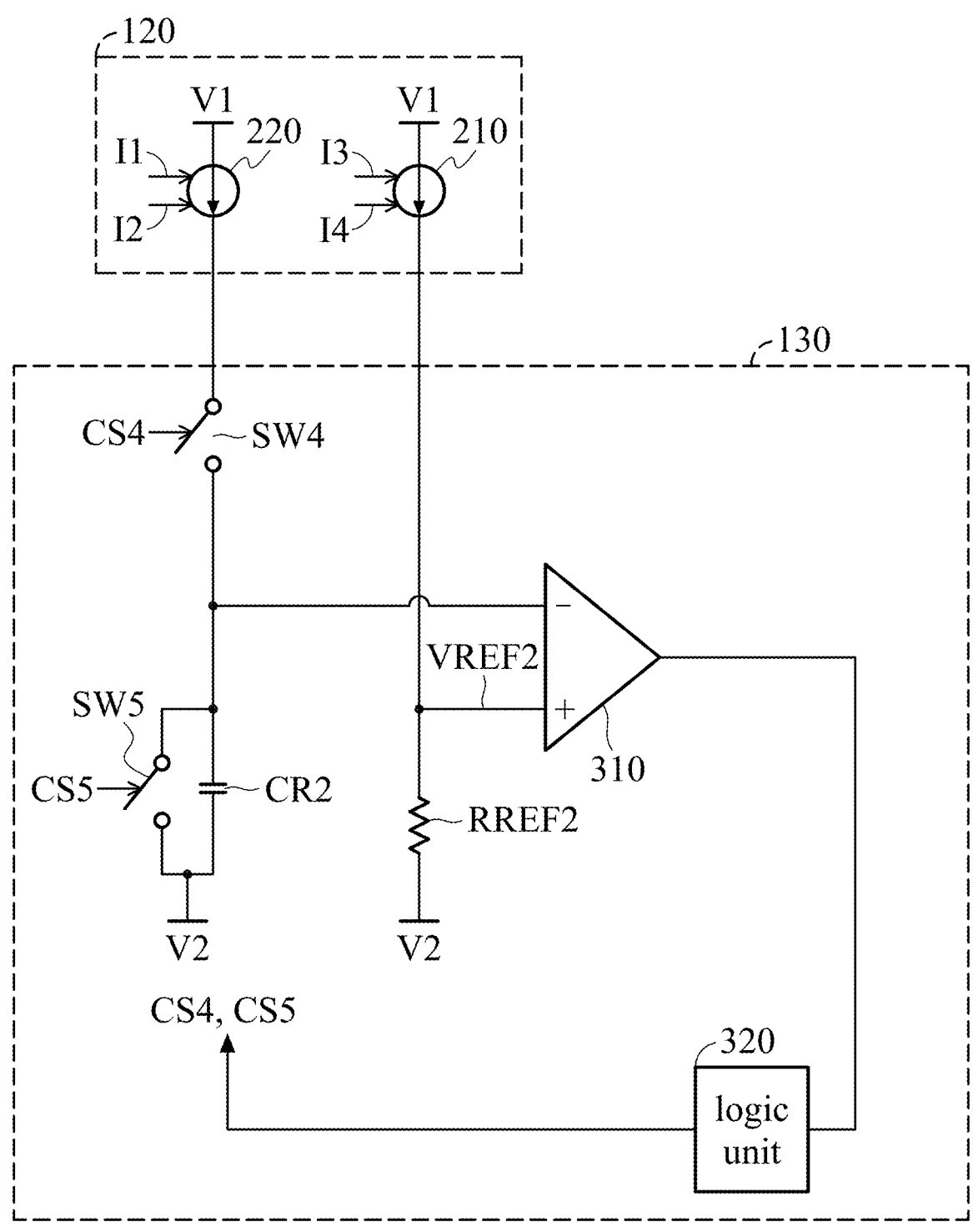
FIG. 3 is another detailed schematic view of a current source and an oscillator circuit in FIG. 1.

FIG. 3 is another detailed schematic view of a current source and an oscillator circuit in FIG. 1. Please refer to FIG. 3. The current source 120 may include a first current source unit 210 and a second current source 220. In the embodiment, the first current source unit 210 and the second current source 220 in FIG. 3 are the same as or similar to the first current source unit 210 and the second current source 220 in FIG. 2. Accordingly, the first current source unit 210 and the second current source 220 in FIG. 3 may refer to the description of the embodiment of FIG. 2, and the description thereof is not repeated herein.

The oscillator circuit 130 may include a resistor RREF2, a comparator 310, a logic unit 320, a first switch unit SW4, a capacitor CR2 and a second switch unit SW5.

The resistor RREF2 has a first terminal and a second terminal. The first terminal of the resistor RREF2 may receive the first reference current IREF2, and generate a voltage VREF2. The second terminal of the resistor RREF2 may receive the reference voltage V2. In some embodiments, the reference voltage V2 may be, for example, a ground voltage, but the disclosure is not limited thereto. In some embodiments, the resistor RREF2 may be any type of resistor, such as a positive temperature coefficient resistor or a negative temperature coefficient resistor, but the disclosure is not limited thereto.

The comparator 310 has a first input terminal, a second input terminal and an output terminal. The first input terminal of the comparator 310 is coupled to the first terminal of the resistor RREF2 and may receive the voltage VREF2. The output terminal of the comparator 310 may generate the oscillating signal. In the embodiment, the first input terminal of the comparator 310 is a positive input terminal, and the second input terminal of the comparator 310 is a negative input terminal, but the disclosure is not limited thereto.

The logic unit 320 has an input terminal and an output terminal. The input terminal of the logic unit 320 is coupled to the output terminal of the comparator 310. The output terminal of the logic unit 320 may generate a first control signal CS1 and a second control signal CS2.

The first switch unit SW4 has a first terminal, a second terminal and a control terminal. The first terminal of the first switch unit SW4 is coupled to the second reference current IREF2. The second terminal of the first switch unit SW4 is coupled to the second input terminal of the comparator 310. The control terminal of the first switch unit SW4 is coupled to the output terminal of the logic unit 320 and may receive the first control signal CS4. That is, the first switch unit SW4 is turned on or turned off according to the first control CS4;

The capacitor CR2 has a first terminal and a second terminal. The first terminal of the capacitor CR2 is coupled to the second terminal of the first switch unit SW4. The second terminal of the capacitor CR2 may receive the reference voltage V2.

The second switch unit SW5 has a first terminal, a second terminal and a control terminal. The first terminal of the second switch unit SW5 is coupled to the first terminal of the capacitor CR2. The second terminal of the second switch unit SW5 is coupled to the second terminal of the capacitor CR2. That is, the second switch unit SW5 is coupled to the capacitor CR2 in parallel. The control terminal of the second switch unit SW5 is coupled to the output terminal of the logic unit 320 and may receive the second control signal CS5. That is, the second switch unit SW5 is turned on or turned off according to the second control signal CS2.

In some embodiments, the first switch unit SW4 and the second switch unit SW5 are turned on in sequence. In some embodiments, the temperature coefficient of the first reference current IREF1 and the temperature coefficient of the second reference current IREF2 are related to the temperature coefficient of the resistor RREF2. That is, when the value of the resistor RREF2 changes according to a change of temperature, the value of the first reference current IREF1 and the value of the second reference current IREF2 may also change accordingly. In some embodiments, when the value of the resistor RREF2 changes according to the change of temperature, the current source 120 may adjust the ratio of the first current I1 and the second current I2 to adjust the first reference current IREF1 and the ratio of the third current I3 and the fourth current I4 to adjust the second reference current IREF2. Therefore, the temperature coefficient the resistor RREF2 may be effectively compensated for by the first reference current IREF1 and the second reference current IREF2, so that the frequency of the oscillating signal of the oscillator device 100 may be stabilized and may not affected by the change of temperature.

In summary, according to the oscillator device disclosed by the disclosure, the current generating circuit generates the first current, the second current, the third current and the fourth current. The current source generates the first reference current according to the first current and the second current, and generates the second reference current according to the third current and the fourth current. The oscillator circuit receives the first reference current and the second reference current and generate the oscillating signal. The temperature coefficient of the oscillator circuit is compensated for by the first reference current and the second reference current. At least two of the first current, the second current, the third current and the fourth current are different. The first reference current is different from the second reference current. Therefore, the temperature coefficient of the oscillator device may be effectively compensated for without the need for two temperature coefficient types of resistors, so that the frequency of the oscillator device is stabilized and not affected by the change of temperature.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An oscillator device, comprising:
a current generating circuit, configured to generate a first current, a second current, a third current and a fourth current;
a current source, coupled to the current generating circuit, and configured to generate a first reference current according to the first current and the second current, and generate a second reference current according to the third current and the fourth current; and
an oscillator circuit, coupled to the current source, and configured to receive the first reference current and the second reference current and generate an oscillating signal, wherein a temperature coefficient of the oscillator circuit is compensated for by the first reference current and the second reference current;
wherein at least two of the first current, the second current, the third current and the fourth current are different, and the first reference current is different from the second reference current;
wherein the first reference current and the second reference current change according to a change of temperature.

2. The oscillator device as claimed in claim 1, wherein the first current and the third current are positive temperature coefficient currents, and the second current and the fourth current are negative temperature coefficient currents.

3. The oscillator device as claimed in claim 1, wherein the current generating circuit is a bandgap on a system on a chip.

4. The oscillator device as claimed in claim 1, wherein the current source adjusts a ratio of the first current and the second current and a ratio of the third current and the fourth current according to the change of temperature.

5. The oscillator device as claimed in claim 1, wherein the current source comprises:
a first current source unit, having a first terminal, a second terminal, a third terminal and a fourth terminal, wherein the first terminal of the first current source unit receives a reference voltage, the second terminal of the first current source unit receives the first current, the third terminal of the first current source unit receives the second current, and the fourth terminal of the first current source unit generates the first reference current; and
a second current source unit, having a first terminal, a second terminal, a third terminal and a fourth terminal, wherein the first terminal of the second current source unit receives the reference voltage, the second terminal of the second current source unit receives the third current, the third terminal of the second current source unit receives the fourth current, and the fourth terminal of the second current source unit generates the second reference current.

6. The oscillator device as claimed in claim 5, wherein the reference voltage is a system voltage.

7. The oscillator device as claimed in claim 1, wherein the oscillator circuit is a frequency locked loop oscillator.

8. The oscillator device as claimed in claim 7, wherein the oscillator circuit comprises:
a resistor, having a first terminal and a second terminal, wherein first terminal of the resistor receives the first reference current, and the second terminal of the resistor receives a reference voltage;
an operation amplifier, having a first input terminal, a second input terminal and an output terminal, wherein the first input terminal of the operation amplifier is coupled to the first terminal of the resistor;
a first capacitor, having a first terminal and a second terminal, wherein the first terminal of the first capacitor is coupled to the second input terminal of the operation amplifier, and the second terminal of the first capacitor is coupled to the output terminal of the operation amplifier;

a filter unit, having an input terminal and an output terminal, wherein the input terminal of the filter unit is coupled to the output terminal of the operation amplifier;

an oscillator unit, having an input terminal and an output terminal, wherein the input terminal of the oscillator unit is coupled to the output terminal of the filter unit, and the output terminal of the oscillator unit generates the oscillating signal;

a logic unit, having an input terminal and an output terminal, wherein the input terminal of the logic unit is coupled to the output terminal of the oscillator unit, and the output terminal of the logic unit generates a first control signal, a second control signal and a third control signal;

a first switch unit, having a first terminal, a second terminal and a control terminal, wherein the first terminal of the first switch unit receives the second reference current, and the control terminal of the first switch unit is coupled to the output terminal of the logic unit and receives the first control signal;

a second capacitor, having a first terminal and a second terminal, wherein the first terminal of the second capacitor is coupled to the second terminal of the first switch unit, and the second terminal of the second capacitor receives the reference voltage; and a second switch unit, having a first terminal, a second terminal and a control terminal, wherein the first terminal of the second switch unit is coupled to the first terminal of the second capacitor, the second terminal of the second switch unit is coupled to the second terminal of the second capacitor, and the control terminal of the second switch unit is coupled to the output terminal of the logic unit and receives the second control signal;

a third switch unit, having a first terminal, a second terminal and a control terminal, wherein the first terminal of the third switch unit is coupled to the second terminal of the first switch unit, the second terminal of the third switch unit is coupled to the second input terminal of the operation amplifier, and the control terminal of the third switch unit is coupled to the output terminal of the logic unit and receives the third control signal.

9. The oscillator device as claimed in claim 8, wherein the oscillator unit is a voltage-controlled oscillator.

10. The oscillator device as claimed in claim 8, wherein the resistor is a positive temperature coefficient resistor or a negative temperature coefficient resistor.

11. The oscillator device as claimed in claim 8, wherein the reference voltage is a ground voltage.

12. The oscillator device as claimed in claim 8, wherein a temperature coefficient of the first reference current and a temperature coefficient of the second reference current are related to a temperature coefficient of the resistor.

13. The oscillator device as claimed in claim 8, wherein when a value of the resistor changes according to a change of temperature, the current source adjusts a ratio of the first current and the second current to adjust the first reference current, and the current source adjusts a ratio of the third current and the fourth current to adjust the second reference current.

14. The oscillator device as claimed in claim 1, wherein the oscillator circuit is an RC oscillator.

15. The oscillator device as claimed in claim 14, wherein the oscillator circuit comprises:

a resistor, having a first terminal and a second terminal, wherein the first terminal of the resistor receives the first reference current, and the second terminal of the resistor receives the reference voltage;

a comparator, having a first input terminal, a second input terminal and an output terminal, wherein the first input terminal of the comparator is coupled to the first terminal of the resistor, and the output terminal of the comparator generates the oscillating signal;

a logic unit, having an input terminal and an output terminal, wherein the input terminal of the logic unit is coupled to the output terminal of the comparator, and the output terminal of the logic unit generates a first control signal and a second control signal;

a first switch unit, having a first terminal, a second terminal and a control terminal, wherein the first terminal of the first switch unit is coupled to the second reference current, the second terminal of the first switch unit is coupled to the second input terminal of the comparator and the control terminal of the first switch unit is coupled to the output terminal of the logic unit and receives the first control signal;

a capacitor, having a first terminal and a second terminal, wherein the first terminal of the capacitor is coupled to the second terminal of the first switch unit, and the second terminal of the capacitor receives the reference voltage; and a second switch unit, having a first terminal, a second terminal and a control terminal, wherein the first terminal of the second switch unit is coupled to the first terminal of the capacitor, the second terminal of the second switch unit is coupled to the second terminal of the capacitor, and the control terminal of the second switch unit is coupled to the output terminal of the logic unit and receives the second control signal.

16. The oscillator device as claimed in claim 15, wherein the resistor is a positive temperature coefficient resistor or a negative temperature coefficient resistor.

17. The oscillator device as claimed in claim 15, wherein the reference voltage is a ground voltage.

18. The oscillator device as claimed in claim 15, wherein a temperature coefficient of the first reference current and a temperature coefficient of the second reference current are related to a temperature coefficient of the resistor.

19. The oscillator device as claimed in claim 15, wherein when a value of the resistor changes according to a change of temperature, the current source adjusts a ratio of the first current and the second current to adjust the first reference current, and the current source adjusts a ratio of the third current and the fourth current to adjust the second reference current.

* * * * *